United States Patent
Felix et al.

(10) Patent No.: US 9,007,113 B1
(45) Date of Patent: Apr. 14, 2015

(54) FLIP-FLOP

(71) Applicant: NVIDIA Corporation, Santa Clara, CA (US)

(72) Inventors: Stephen Felix, Bristol (GB); Stéphane Badel, Zurich (CH)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/149,477

(22) Filed: Jan. 7, 2014

(51) Int. Cl.
*H03K 3/037* (2006.01)

(52) U.S. Cl.
CPC ..................................... *H03K 3/037* (2013.01)

(58) Field of Classification Search
CPC .............................. H03K 3/0233; H03K 3/037
USPC .......... 327/208, 199, 200, 201, 210, 211, 212, 327/214, 215
See application file for complete search history.

(56) References Cited

U.S. PATENT DOCUMENTS

| | | | |
|---|---|---|---|
| 2009/0108885 A1* | 4/2009 | Natonio et al. | 327/115 |
| 2009/0115482 A1* | 5/2009 | Bertin | 327/218 |
| 2010/0034030 A1* | 2/2010 | Asano et al. | 365/189.05 |

OTHER PUBLICATIONS

Stojanovic, V., et al., "Comparative Analysis of Latches and Flip Flops for High Performance Systems," IEEE Journal of Solid-State Circuits, vol. 34, Issue 4, Apr. 1999, pp. 536-548.

* cited by examiner

*Primary Examiner* — Jung Kim

(57) ABSTRACT

According to one aspect of the present disclosure, there is provided a flip flop circuit, comprising a first input circuit configured to receive a clock input signal and input data and comprising a first node. The flip-clop circuit further comprises a second input circuit configured to receive the input data and an inverse of the clock signal and comprising a second node. The first and second input circuits are configured such that the first node and the second node are pre-charged to respective complementary states when the clock signal is at a first level and, dependent on a value of the input data, one of said first and second nodes changes state to a state complementary to its pre-charged state when the clock signal transitions from the first level to a second level.

20 Claims, 4 Drawing Sheets

US 9,007,113 B1

FLIP-FLOP

TECHNICAL FIELD

This application is directed, in general, to circuits and, more specifically, to flip-flop circuits.

BACKGROUND

One commonly used circuit is a flip-flop circuit. A flip-flop is used in a wide range of applications such as, for example, microprocessors, memory devices and registers.

One performance parameter of a flip-flop circuit is the insertion delay. The insertion delay is the sum of the set-up time and the propagation delay. The set-up time is the duration of time that input data into the flip-flop must be held steady before a clock edge so that the data is reliably sampled by the clock. The propagation delay is the time required from the clock transition for the output signal to change state. The insertion delay is a measure of how much of the clock cycle time is consumed by the flip-flop circuit.

Another performance parameter is the clock loading. The operation of a flip-flop circuit is driven by the clock, and a single chip can contain many flip-flops, often of the order of thousands. The clock may constitute a proportion of the power used by a circuit. Due to the large numbers of flip-flops used on a single chip, a flip-flop design with a reduced clock loading may lead to a chip with a reduced power consumption.

SUMMARY

According to one aspect of the present disclosure, there is provided a flip flop circuit, comprising a first input circuit configured to receive a clock input signal and input data and comprising a first node. The flip-clop circuit further comprises a second input circuit configured to receive the input data and an inverse of the clock signal and comprising a second node. The first and second input circuits are configured such that the first node and the second node are pre-charged to respective complementary states when the clock signal is at a first level and, dependent on a value of the input data, one of said first and second nodes changes state to a state complementary to its pre-charged state when the clock signal transitions from the first level to a second level.

BRIEF DESCRIPTION OF THE DRAWINGS

Reference is now made to the following descriptions taken in conjunction with the accompanying drawings, in which.

DETAILED DESCRIPTION

Embodiments of the present disclosure will now be described by way of example only. It will be apparent to one of skill in the art that the present disclosure may be practiced without one or more of the specific details set forth in the following description. In other instances, well-known features have been omitted so as not to obscure the present disclosure.

Figure 1:
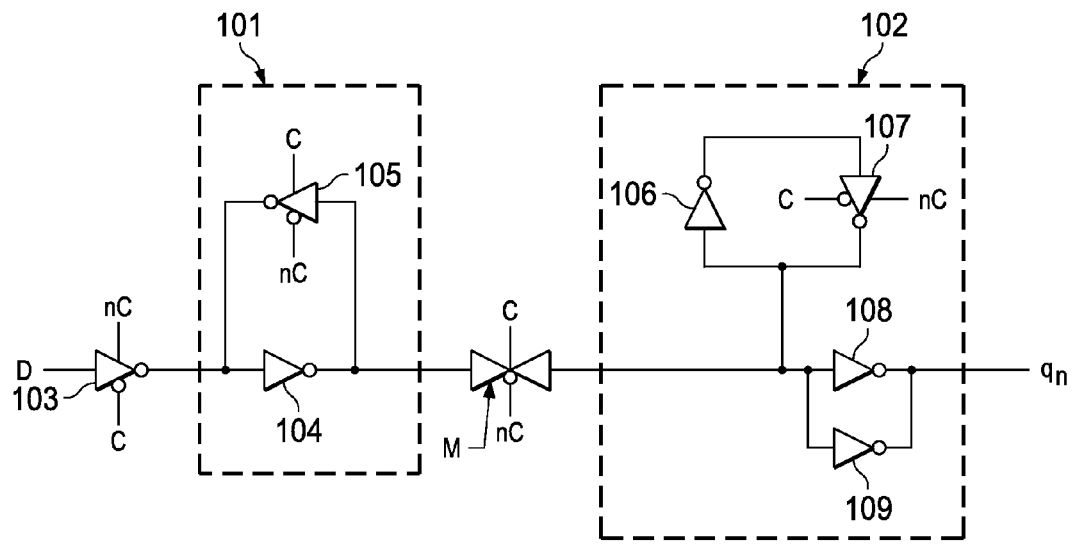
FIG. 1 is a block diagram of a Master-Slave (MS) flip-flop.

An example of a Master-Slave (MS) flip-flop circuit is shown in FIG. 1.

The circuit comprises a tri-state inverter 103, a master latch 101, a pass-gate M and a slave latch 102. The master latch 101 is made up of an inverter 104 with a tri-state inverter 105 in a feedback loop from the output of the inverter 104 to its input. The slave latch 102 comprises an inverter 106 and a tri-state inverter 107 in a feedback loop from the output of the inverter to its input. The output of the inverter 107 is also coupled to the input of an inverter 108 and inverter 109. The output of inverters 108 and 109 is the signal $q_n$. The value of $q_n$ is the logical inverse of the input data D when the clock signal transitions to high. The flip-flop circuit therefore operates as an inverting flip-flop.

One factor in the insertion delay of a flip-flop circuit is the number of CMOS stages between the data input and the output. For example, the circuit 100 contains three CMOS stages between the input data D and output signal $q_n$: a first stage defined by the tri-state inverter 103; a second stage defined by inverter 104 and pass-gate M; and a third stage defined by the parallel arrangement of inverters 108 and 109.

The clock loading of circuit 100 contains a clock loading presented to the clock signal C of four transistor devices.

Figure 3:
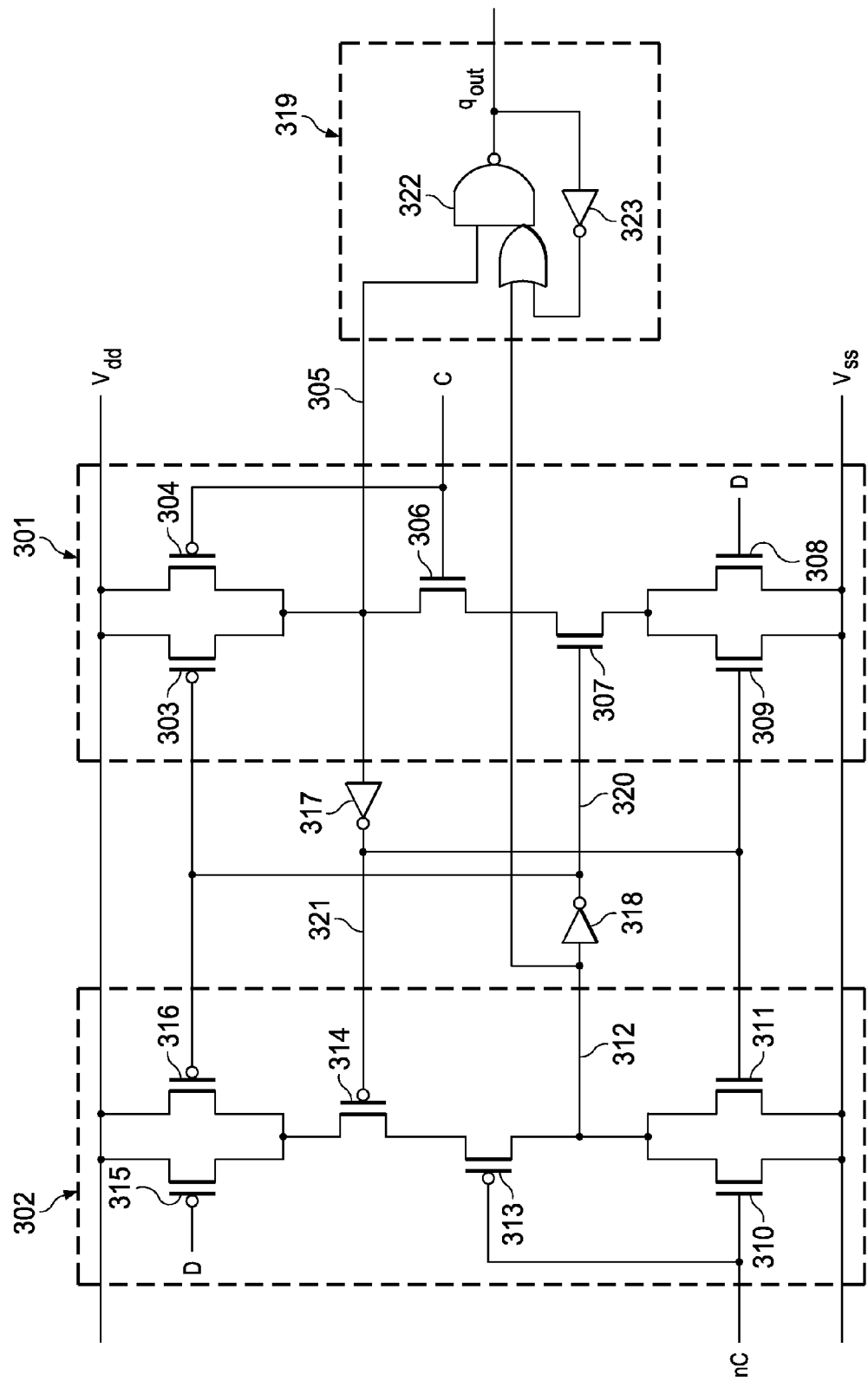
FIG. 3 is a schematic diagram of a flip-flop according to an embodiment of the present disclosure.

A flip-flop circuit according to an embodiment is shown in FIG. 3.

The flip-flop circuit 300 comprises a first input stage 301 and a second input stage 302.

The first input stage 301 comprises p-type transistors 303, 304 and n-type transistors 306, 307, 308 and 309. A node 305 is coupled to the drains of p-type transistors 303 and 304 which in turn have respective sources coupled to an upper voltage rail $V_{dd}$. The gate of transistor 304 receives the clock signal C and the gate of transistor 303 is coupled to a node 320. Node 305 is coupled to a lower voltage rail $V_{ss}$ by n-type transistors 306, 307, 308 and 309. In particular, node 305 is coupled to the drain of transistor 306 which has a source connected in series to transistor 307. The gate of transistor 306 receives the clock signal. Transistor 307 is connected in series to a parallel arrangement of transistors 308 and 309. The gate of transistor 307 is coupled to a node 320. The sources of transistors 308 and 309 are connected to the lower voltage rail $V_{ss}$. The gate of transistor 308 is configured to receive the data signal D and the gate of transistor 309 is coupled to a node 321.

The second input stage 302 comprises n-type transistors 310 and 311 and p-type transistors 313, 314, 315 and 316. Node 312 is coupled to the drains of n-type transistors 310 and 311 which in turn have sources coupled to the lower voltage rail. The gate of transistor 310 receives the inverse of the clock signal nC and the gate of transistor 311 is coupled to the node 321. Node 312 is coupled to the upper voltage rail by p-type transistors 313, 314, 315 and 316. Node 312 is coupled to the drain of transistor 313 which has a source connected in series to transistor 314. The gate of transistor 313 receives an inverse of the clock signal and the gate of transistor 314 is coupled to node 321. Transistor 314 is connected in series to a parallel arrangement of transistors 315 and 316. The sources of transistors 315 and 316 are connected to the upper voltage rail. The gate of transistor 315 is configured to receive the data signal D and the gate of transistor 316 is coupled to node 320.

Node 305 has an associated logic level denoted by Fn and node 312 has an associated logic level denoted by Fp. When either node 305 or 312 is pulled high to the upper voltage rail, the associated logic level is 1; when either node is pulled low to the lower voltage rail the associated logic level is 0.

Node 305 is coupled to the input of an inverter 317. The output of inverter 317 is coupled to the node 321 with an associated logic level Fnn=not(Fn). Node 312 is coupled to the input of an inverter 318. The output of inverter 318 is coupled to the node 320 with an associated logic level Fpn=not(Fp).

Both input stages have one output and one or more inputs. The output of stage 301 is the node 305 with the associated value Fn. Stage 301 receives as its inputs the clock signal C, data D and the node 320 with the associated value Fpn. The output of stage 302 is the node 312 with the associated value Fp. Stage 302 receives as its inputs the inverse clock signal nC, data D and the node 321 with associated value Fnn.

Both input stages 301 and 302 encompass circuitry that connects an output node (i.e., node 305 for stage 301, and node 312 for stage 302) to either logic "1" or logic "0". The output of the stages 301 and 302 is driven to either logic "1" or logic "0" depending on the value of the input(s) and the "logic function" that the stage embodies.

In the arrangement of FIG. 3, the source of transistor 314 is connected in series to the parallel arrangement of transistors 315 and 316, which are both source-connected to the upper voltage rail. It will be appreciated by the skilled person that this arrangement is merely by way of example, and that other arrangements are possible without altering the functionality of the circuit. For example, the series connected transistors 313, 314 and 315 may be arranged in six possible ways. For each of these arrangements, transistor device 316 (which operates as a keeper device), can be arranged in parallel with transistor 315 or 314 alone or alternatively in parallel with both 315 and 314. In some embodiments, transistor device 313 is not arranged in parallel with transistor 316. Similarly, the series connected transistors 306, 307 and 308 may be arranged in six possible ways. For each of these arrangements, transistor device 309 (which also operates as a keeper device) can be arranged in parallel with either transistor 307 or 308 alone or, alternatively, in parallel with both 307 and 308. Preferably transistor 309 is not arranged in parallel with transistor 306.

The flip-flop circuit 300 further comprises a latch circuit 319. The latch circuit comprises an OR-AND-Invert gate 322. The output of the OR-AND-Invert gate 322 is a value $q_{out}$ and provides the input of an inverter 323. The output of inverter 323 is the inverse of $q_{out}$, denoted by $q_n$, and provides an input of OR-AND-Invert gate 322 to form a feedback loop. The OR-AND-Invert gate represents a further stage. The values Fn and Fp are also inputs into the OR-AND-Invert gate. The output of the OR-AND-Invert gate is determined by the inputs $q_n$, Fp and Fn by the logical expression:

$$q_{out}=not(Fn \text{ AND}(Fp \text{ OR } q_n)) \quad (1)$$

In operation, the clock signal C varies between a low level (logic level 0) and a high level (logic level 1). The inverse signal nC is at the opposite logic level to the clock signal C; that is, when C is high, nC is low and when C is low, nC is high.

The operation of the flip-flop circuit of FIG. 3 will be described with reference to FIG. 2, which is a schematic diagram showing the logical values Fn and Fp associated with two nodes of the circuit as a function of a clock signal C and input data D which are input into the circuit.

Clock Level Low

When the clock signal C is low, transistors 304 and 310 are both on, i.e., both transistors 304 and 310 operate as closed switches. It can be seen with reference to FIG. 3 that when this occurs, node 305 (Fn) is pulled high to logic level 1 and node 312 (Fp) is pulled low to logic level 0.

As used herein, a pair of states are said to be complementary if the logical value associated with one of the states is the logical opposite of the value associated with other state. The logical values of 1 and 0 are complementary values in the sense that the logical value of the nodes is either 0 or 1. The value 0 is then said to be the complementary value of 1 and vice versa.

Figure 2:
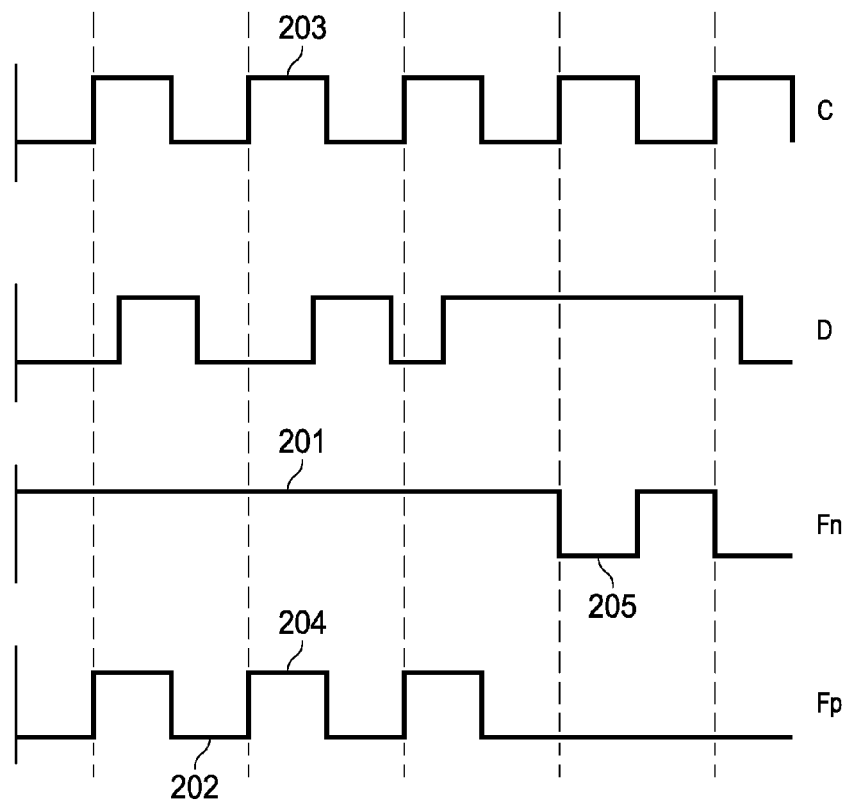
FIG. 2 is a schematic diagram of the logical levels of nodes within a circuit according to an embodiment as a function of an input clock signal and input data D.

Therefore when the clock is low, nodes 305 and 312 are pre-charged to respective complementary states (illustrated at 201 and 202 of FIG. 2). When node 305 is in its pre-charged state it has an associated logic level Fn=1 and when node 312 is in its pre-charged state it has an associated logic level Fp=0. Moreover, node 305 is prevented from being pulled low because transistor 306 is off and node 312 is prevented from being pulled high because transistor 313 is off. It further follows that that the value of Fnn=not(Fn)=0 and the value of Fpn=not(Fp)=1.

Notice that the values of Fn and Fp are independent of the data D when the clock is low. The logical levels of the nodes are summarized in the table below for the situation in which the clock is low.

TABLE 1

| Summary of logical values for C = 0 | | | | | | |
|---|---|---|---|---|---|---|
| C | nC | D | Fn | Fp | Fnn | Fpn |
| 0 | 1 | X | 1 | 0 | 0 | 1 |

In the table above, the value of the data D is denoted by 'X' to represent the fact that the value of the data has no effect on the logical values of Fn and Fp when the clock is low.

To analyze the behavior of the circuit when the clock is low, reference will be made to the latch sub-circuit 319. Consider the situation where, when the clock transitions to low, the output value $q_{out}$ is equal 1. Fn and Fp will be pre-charged to complementary values of 1 and 0 respectively. The output of inverter 323 is low, and so by reference to the logical expression (1) it can be seen that the output from the OR-AND-Invert gate will be 1. Therefore the latch 319 operates to lock onto the value of $q_{out}$ present when the clock transitions to low. Likewise, if the value of $q_{out}$ when the clock transitions to low is 0 the sub-circuit 319 operates to lock onto this value.

Clock Level High

When the clock value C transitions to high (203), then either the value of Fp rises to 1 (and consequently Fpn falls to 0), or the value of Fn falls to 0 (and consequently Fnn rises to 1). Whether Fp rises or Fn falls is determined by the value of the data D at the time the clock transitions to high. That is, nodes 305 and 312 are dynamic nodes, and the transition of the clock signal from low to high causes either the logical value associated with node 305 to change to 0 or the logical value associated with node 312 to change to 1. If the logical value of node 305 changes to 0, node 305 is said to be in a state complementary to its pre-charged state, and if the logical value of node 312 changes to 1, node 312 is said to be in a state complementary to its pre-charged state.

At the time the clock transitions to high, either the logical value of node 305 or the logical value of node 312 will change depending on the value of the input data D at the time the clock transitions. With reference to FIG. 2, it can be seen that when the clock transitions to high, then either both Fn and Fp=1 or both Fn and Fp=0. That is, when the clock transitions to high one of the nodes will change state so that both nodes will then be in the same state whilst the clock is high.

When the clock transitions to high, transistors 313 and 306 are on and transistors 304 and 310 are off.

The second input stage will therefore operate to pull node 312 low if transistor 311 is on (i.e., Fnn=1).

In contrast, the second input stage will operate to pull node 312 high if the following conditions are satisfied:
(i) Transistor 314 is activated (i.e., Fnn=0) and
(ii) Either transistor 315 is activated (i.e., the input data D=0) or transistor 316 is activated (i.e., Fpn=0).

When the clock first transitions from low to high it is known that Fn=1 and that Fnn=0. The logical value of Node 312 will therefore change to 1 if the input data D=0 (204).

The first input stage operates to pull node 305 high if transistor 303 is activated (i.e., Fpn=0), and operates to pull the node low if:
(i) Transistor 307 is activated (i.e., Fpn=1) and
(ii) Either transistor 308 is activated (input data D=1) or transistor 309 is activated (Fnn=1).

When the clock first transitions to high it is known that Fp=0 and that Fpn=1, and therefore the logical value of node 305 will change to 0 if the input data D=1 (205).

This embodiment may have the advantage that the first and second input stages are configured such that the change of state of a node of one input stage causes the node of the other input stage to be actively driven to its pre-charged state, as opposed to simply 'floating' at its pre-charged state, where it will be susceptible to leakage and noise.

For example, Node 305 is pre-charged to logical value 1 and node 312 to logical value 0. If a clock transition causes node 312 to change state to logical value 1, the inverse value Fpn of node 320 changes to 0 which activates transistor 303 and de-activates transistor 307. Thus the first input stage is configured such that the change of state of node 312 to the state complementary to its pre-charged state causes node 305 to continue to be driven to its pre-charged state whilst also preventing it from being driven to its complementary state.

Similarly, if a clock transition causes node 305 to change states to a logical value of 0, the inverse value Fnn will change to 1 which activates transistor 311 and de-activates transistor 314. Therefore the second input stage is configured such that the change of state of node 305 to the state complementary to its pre-charged state causes node 312 to continue to be driven low to its pre-charged state whilst also preventing it from being pulled high to its complementary state.

In other words, the change of state of one node prevents the other node from changing state.

Circuit 300 operates such that, once the clock signal has transitioned to high, further variations in the input data D do not affect the values of Fn and Fp of nodes 305 and 312 respectively. For example, consider the scenario where the clock transitions to high and the input data D=1, so that node 305 changes state to logical level 0 and node 312 is maintained at its pre-charged state. The change of state of node 305 to its complementary state activates transistor 309 by way of node 321 with inverse value Fnn. Thus, even if the input data D varies whilst the clock is high (thus potentially de-activating transistor 308), the first input stage still operates to pull node 305 low to its complementary state. Transistor 316 operates in an analogous manner in relation to node 312 in the event that node 312 changes state to its complementary state.

It can be seen with reference to the latch sub-circuit 319 that if node 305 changes state such that Fn=Fp=0, the output signal $q_{out}$ will be set to 1, whereas if node 312 evaluates such that Fn=Fp=1, the output signal $q_{out}$ will be reset to 0. Latch sub-circuit 319 therefore operates to output a signal $q_{out}$ that tracks the value of the input data D at the time the clock rises, and locks onto that value at all other times.

The following table summarizes the logical values associated with the circuit 300 for a low clock level and a high clock level.

TABLE 2

Logical values associated with circuit 300

| C | D | Fn | Fp | Fnn | Fpn | $q_{out}$ |
|---|---|----|----|-----|-----|-----------|
| 0 | X | 1 | 0 | 0 | 1 | previous |
| 1 | X | 1 | 1 | 0 | 0 | 0 |
| 1 | X | 0 | 0 | 1 | 1 | 1 |
| ⌐ | 0 | 1 | 1 | 0 | 0 | 0 |
| ⌐ | 1 | 0 | 0 | 1 | 1 | 1 |

The value 'previous' represents the value of $q_{out}$ output from the circuit when the clock transitions to low, i.e. the output value locked by the latch 319 when the clock transitions to low from a previous cycle. The value 'X' denotes that the value of the input data D has no effect on the values of Fn, Fp or $q_{out}$. The second and third rows summarize the logical values when the clock has transitioned to high and the first stage has had time to evaluate. The fourth and fifth rows summarize the logical values when the clock transitions from low to high and illustrates that either Fp evaluates to 1 or Fn evaluates to 0 depending on the value of the input data D when the clock transitions.

It can be seen with reference to the above description and Table 2 that the nodes 305 and 312 therefore effectively operate as a 'set' and 'reset' input into a set-reset (SR) latch. The node 312 and associated logic value Fp operate as a 'reset' input into a SR latch—when the value Fp rises to 1 the output from the circuit $q_{out}$ is reset to 0. By comparing the logical values of Table 2 with a truth table of a SR flip-flop, it can be seen that node 305 and associated logical value Fn operate as the logical opposite of a 'set' input. That is, when Fn falls to 0 the output value $q_{out}$ is set to 1, and the combination of Fn=1 and Fp=0 causes the circuit 300 to output the value stored in the latch circuit. Moreover, Fn and Fp operate to track the value of the input data D at the time the clock signal transitions to high, but with logical values that are opposite to the value of the data D. Thus the values Fn and Fp operate to set and reset the latch sub-circuit by tracking the value of the input data D at the time of a clock transition and drive the output of the latch circuit directly.

The circuit 300 of the present embodiment presents a clock loading of only two transistors to the input clock signal (transistors 304 and 306). Similarly the inverse clock signal nC has a loading of two transistors (310 and 311). The sum of the loadings of the signals C and nC is connected to the charge that must be moved with each clock cycle, and therefore with the power consumption of the circuit. The flip-flop circuit of some embodiments may have a lower clock loading compared to other flip-flop circuits. This may lead to a reduced power consumption.

The flip-flop circuit of some embodiments may only have two stages between an input data signal D and the output data $q_{out}$. In flip-flop circuit 300, data D is input into stages 301 and 302. The output of stages 301 and 302 (Fn and Fp respectively) are then input into the latch sub-circuit 319, which represents a further stage, to generate the output signal $q_{out}$. Thus in the circuit 300 there are only two stages between a particular data input D and the output signal $q_{out}$.

The stages 301 and 302 of the circuit 300 operate to produce the 'set' and 'reset' inputs respectively, which are used to drive a latch sub-circuit. This reduced number of stages of some embodiments may help to reduce the insertion delay associated with the flip-flop.

Figure 4:
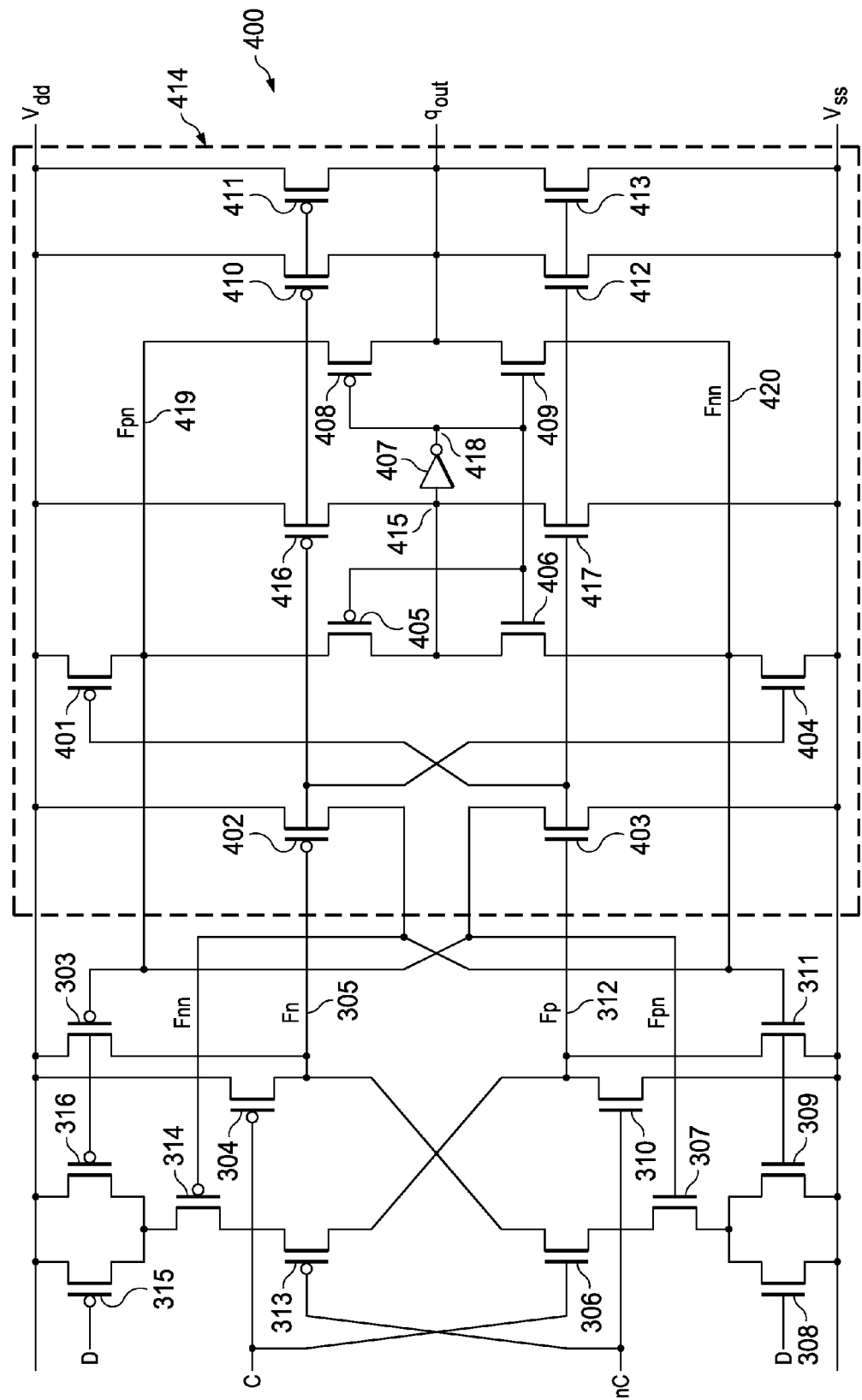
FIG. 4 is a schematic diagram of a flip-flop according to another embodiment.

FIG. 4 shows an alternative embodiment, wherein like reference numerals with FIG. 3 denote like components.

FIG. 4 depicts a circuit 400 comprising first and second input stages as in FIG. 3. The operation of these stages is as described above and is not repeated here.

The inverter 318 of circuit 300 is shown replaced by p-type transistors 401 and n-type transistor 403. The gates of transistors 401 and 403 are coupled to node 312, and their drains are coupled to node 419. The sources of transistors 401 and 403 are coupled to the upper and lower voltage rails respectively. Thus transistors 401 and 403 operate as an inverter to invert input state Fp to output state Fpn.

In addition, inverter 317 of circuit 300 is shown by p-type transistor 402 and n-type transistor 404, which have gates coupled to node 305 and drains coupled to node 420. The sources of transistors 402 and 404 are coupled to the upper and lower voltage rails respectively. Transistors 402 and 404 therefore operate as an inverter to invert input state Fn to output state Fnn.

Circuit 400 comprises a latch circuit 414. The latch circuit comprises a node 415 that is coupled to the drains of transistors 405, 406, 416 and 417 and to the input of an inverter 407. The sources of transistors 416 and 417 are coupled to the upper and lower voltage rails respectively. The source of transistor 405 is connected in series to transistor 401 and the source of transistor 406 is connected in series to the transistor 404. Transistors 406 and 417 are n-type and transistors 405 and 416 are p-type.

A node 418 is coupled to the output of inverter 407 and to the gates of transistors 408, 409, 405 and 406. The source of transistors 408 and 405 are coupled to node 419 which is held at the value Fpn. The source of transistors 406 and 409 are coupled to node 420 which is held at value Fnn. The nodes 419 and 420 operate to close the latch circuit 414. Transistor 408 is a p-type transistor and transistor 409 is an n-type transistor.

When the clock signal C is low, Fpn and Fnn are precharged to 1 and 0 respectively and the latch circuit 414 operates as a latch circuit locked onto the value of q stored at the time the clock transitions to low.

If a rising clock signal causes the value Fn to change to 0 and therefore Fnn to change to 1, the latch circuit 414 operates to set the output value $q_{out}$ to 1. On the other hand, if the rising clock signal causes the value Fp to change to 1 and therefore Fpn to change to 0, the output $q_{out}$ is reset to 0. As discussed above in relation to FIG. 3, the first and second stages are configured such that further variations of the input data D whilst the clock is high do not change the values of Fp or Fn, and therefore the latch circuit 414 will continue to output the value $q_{out}$ caused by the clock transition to high regardless of any variations of the input data whilst the clock is high. Once the clock transitions to low, the value of q present in the latch is locked.

The value of $q_{out}$ tracks that of q, however the inverter 407 and transistors 408 and 409 act to buffer the output signal $q_{out}$ from the value q. This may have the advantage that the output signal $q_{out}$ is not noise sensitive because it is isolated from the feedback loop internal to the latch sub-circuit. In other words, any variations of $q_{out}$ due to noise etc. will not affect the value of q internal to the latch circuit 414.

In some embodiments, it may be desirable for a flip-flop circuit to have scan capability for the purposes of scan testing. Scan test capability is provided by a second, alternative input, known as a scan input in parallel to the data input. The scan input is typically implemented by placing a multiplexor in front of the data input which selects either the scan input or the data input data. In a scan chain, multiple flip-flops are connected together to form a scan-chain by connecting the output of one flip-flop to the scan input of the next flip-flop.

The behavior of the flip-flop depends upon a scan-enable signal. When the scan-enable signal is asserted (i.e., has a logical value of 1), the flip-flop operates using the scan data as the input data. When the scan-enable signal is not asserted (i.e., has a logical value of 0), the flip-flop circuit operates using the standard data input. When the scan-enable signal is asserted, each rising clock edge causes the scan data to be transferred from one flip-flop to the next flip-flop in the scan chain. The stored scanned data is scanned out of the circuit at a scan-output, allowing the tester to observe the data.

Figure 5:
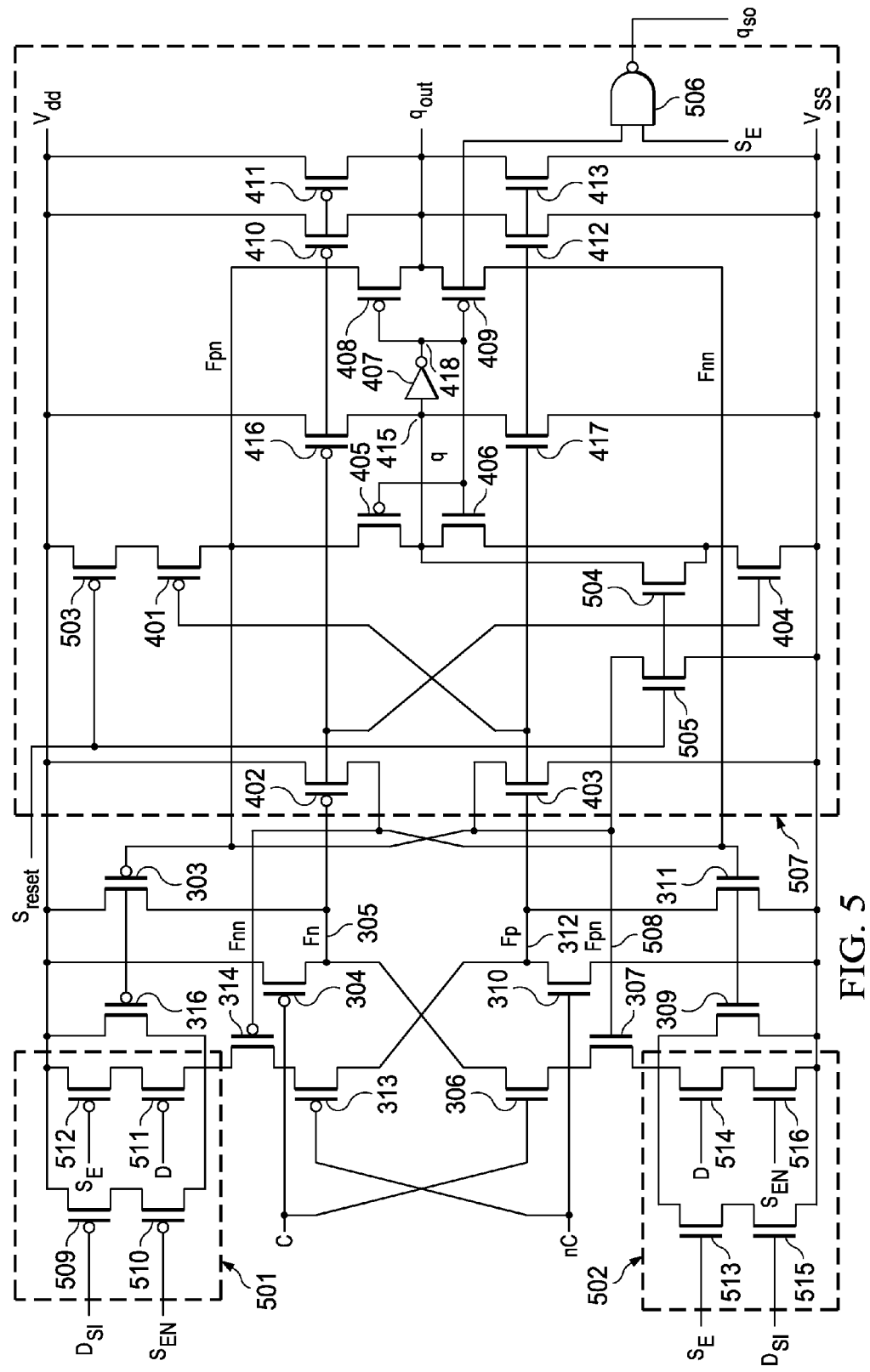
FIG. 5 is a schematic diagram of a flip-flop with a scan-input multiplexor and asynchronous reset input according to another embodiment.

FIG. 5 shows a circuit 500 according to an embodiment for use in a scan chain and having an asynchronous reset input. Like components with earlier figures are denoted by like reference numerals.

Circuit 500 operates in an analogous manner to circuits 300 and 400 but with additional functionality provided by a scan-input multiplexor and asynchronous reset input.

Circuit 500 comprises a first input stage and a second input stage analogous to the first and second input stages of circuit 300 and 400. However, transistor 315 has been replaced by input multiplexor 501 and transistor 308 has been replaced by multiplexor 502. Thus, the first input stage of circuit 500 comprises transistors 304, 303, 306, 307, 309 and multiplexor 502 and node 305. The second input stage comprises transistors 310, 311, 313, 314, 316 and multiplexor 501 and node 312. The circuit further comprises a sub-circuit 507 which operates as a latch with an asynchronous reset input.

Multiplexor 501 comprises p-type transistors 509, 510, 511 and 512. Transistors 509 and 510 are connected in series, with the source of transistor 509 connected to the upper voltage rail. Transistors 512 and 511 are connected in series with the source of transistor 512 connected to the upper voltage rail. The drains of transistors 510 and 511 are coupled to the source of transistor 314 and the drain of transistor 316. The gate of transistor 509 is configured to receive the scan input data, denoted by DSI and the gate of transistor 511 is configured to receive the data input D. The gate of transistor 512 is configured to receive a scan-enable signal SE and the gate of transistor 510 is configured to receive the inverse of the scan enable signal, $S_{EN}$.

Multiplexor 502 comprises n-type transistors 513, 514, 515 and 516. Transistors 513 and 515 are connected in series, with the source of transistor 515 connected to the lower voltage rail VSS. Transistors 514 and 516 are also connected in series, with the source of transistor 516 connected to the lower voltage rail. The drains of transistors 513 and 514 are coupled to the source of transistor 307 and the drain of transistor 309. The gate of transistor 514 is configured to receive the data input and the gate of transistor 515 is configured to receive the scan input data. The gate of transistor 513 is configured to receive the scan-enable signal SE and the gate of transistor 516 is configured to receive the inverse of the scan enable signal.

The reset input, denoted by $S_{reset}$, is input into the gates of transistors 503, 505 and 504. Transistor 503 is connected in series with transistor 401 and is source-connected to the upper voltage rail. The drain of transistor 505 is coupled to a node 508 which has an associated logic level Fpn. Transistor 505 is source-connected to the lower voltage rail. The source of transistor 504 is connected in series to transistor 404 and the drain is coupled to node 415 of the latch circuit 507. Node 508 is coupled to the gate of transistor 307.

Clock Level Low

When the clock signal C is low (and the inverse signal nC is therefore high), the first and second input stages are configured such that node 305 is pulled high (and therefore pre-charged to logical value 1) and node 312 is pulled low (and therefore pre-charged to logical value 0).

If the reset input is not asserted (i.e., $S_{reset}$=0), then transistors 503, 504 and 505 are de-activated and sub-circuit 507 functions as a latch circuit analogous to sub-circuit 414 described with reference to FIG. 4.

Clock High

When the clock value C transitions to high (and the inverse nC transitions to low), then either node 305 changes from its pre-charged state to its complementary state or node 312 changes state from its pre-charged state to its complementary state. Whether node 305 or 312 changes state when the clock transitions to high is determined by whether scan-enable signal SE is asserted. If the scan enable signal SE is asserted, then scan input data DSI determines which node changes state; if the scan enable signal $S_E$ is not asserted, then data input D determines which node changes state. Signal $S_{EN}$ is the inverse of the scan-enable signal $S_E$, i.e., $S_{EN}$ is not asserted when $S_E$ is asserted and $S_{EN}$ is asserted when $S_E$ is not asserted.

It can be seen with reference to the multiplexors 501 and 502 that when the scan-enable signal is not asserted ($S_E$=0), then the first and second input stages of circuit 500 operate in the same manner as the first and second input stages described with reference to FIGS. 3 and 4. When the scan-enable signal is asserted, the first and second input stages of circuit 500 operate in the same manner as those described with reference to FIGS. 3 and 4 except with the scan input data $D_{SI}$ taking the place of the input data D. Thus when the scan-enable signal is asserted and the clock transitions to high, the scan input data determines the values of Fpn and Fnn used within the latch sub-circuit 507 to drive the output value $q_{out}$.

Circuit 500 further comprises a NAND-gate 506 used to output the scan output data, denoted $q_{so}$. NAND-gate 506 receives as its inputs the scan-enable signal $S_E$ and the inverse of the internal node value q, denoted by nq. When the scan-enable signal is asserted, the scan output signal $q_{so}$ will be the value of the scan input data $D_{SI}$ sampled when the clock transitioned to high. When the scan-enable signal is not asserted, the scan-output signal will be set to 1.

Asynchronous Reset

Circuit 500 contains an asynchronous reset input $S_{reset}$ which drives the gates of transistors 503, 505 and 504. It can be seen with reference to FIG. 5 that when the signal $S_{reset}$ is asserted, transistor 505 is activated and therefore node 508 is pulled low to a logic level of 0. In addition, the assertion of the reset input de-activates transistor 503, which prevents node 508 from also being pulled high to logic level 1, and therefore the signal $S_{reset}$ forces the value of Fpn to 0. This in turn activates transistor 303 and therefore node 305 is pulled high (i.e., Fn changes value to 1). Moreover, transistor 307 is deactivated when node 508 is pulled low, and so node 305 is prevented from also being pulled low and thus is forced high. Node 305 changing its value to 1 activates transistor 404, therefore pulling the value Fnn to 0. Node 305 changing its value to 1 also deactivates transistor 402, thus preventing Fnn from also being pulled high.

The asynchronous input therefore resets the values of Fnn and Fpn to be 0, regardless of the clock signal C.

The asynchronous reset also causes the value of q to be reset to 0, regardless of the clock signal C. Referring to FIG. 5, asserting the signal $S_{reset}$ activates transistor 504. The value q of node 415 is therefore pulled down to the value of Fnn.

When $S_{reset}$ is asserted, the value of Fnn is 0 due to the activation of transistor 404 by node 305, which as described above is pulled high when $S_{reset}$=1. In addition, transistor 503 is deactivated when $S_{reset}$=1, and therefore the value of q is forced to 0 and the value of qn forced high to 1, which drives the output value $q_{out}$ to 0.

Therefore regardless of the value of the clock signal C or the input data into the circuit, the reset allows the value of the output to be forced low at any time.

When the reset input is released, that is, $S_{reset}$=0, the flip-flop maintains its reset state. If, for example, the value of $S_{reset}$ changes to 0 when the clock is low, then Fn and Fp will be forced back to their pre-charged states, as described above. When Fn and Fp are in their pre-charged states, the sub-circuit 507 operates as a latch circuit and the stored values of q and qn are held.

Alternatively the value of $S_{reset}$ may change to 0 when the clock is high. In this case, the value of Fnn and Fpn will be 0 (from when the reset input was asserted), and therefore transistors 314 and 316 are both on and transistor 311 is off. Consequently, node 312 will continue to be pulled high whilst being prevented from being pulled low, i.e., node 312 is maintained at its reset level. If node 312 is pulled high, then consequently transistor 403 is on and transistor 401 is off which maintains the value of Fpn low in the absence of a reset. By maintaining the value of Fpn low, the value of Fn is maintained high through transistor 303, which is on. Maintaining the value of Fn high causes transistors 402 and 311 to drive Fnn low. Thus if the reset input $S_{reset}$ changes to 0 when the clock is high, the values of Fp and Fn are maintained in their reset state, i.e. the state they were in when the reset input $S_{reset}$=1. Thus the flip-flop circuit operates to maintain its reset state when the reset input is released.

In typical MS flip-flops known in the prior art, both master and slave stages need to have reset circuitry added. In the flip-flop circuit 500, the first and second input stages with output values Fn and Fp do not require any additional reset circuitry, and thus reset functionality can be added without changing these stages. In some embodiments, driving the NAND-gate from node qn may have the advantage that the node q is not slowed down.

Alternatively or additionally, circuit 500 could be modified to include an asynchronous 'set' input. That is, circuit 500 could be arranged to receive an asynchronous set input instead of a reset input which functions to force the value of q to 1. Alternatively, circuit 500 could be arranged to include both a reset and a set input which could be used to set the value of q to 1 or reset it to 0.

It will be appreciated that the embodiments described herein are illustrative and that various modifications are possible, For example, the depiction of transistors as p-type or n-type is by way of illustration only and each p-type transistor could instead be replaced by an n-type transistor and vice versa. Reference to any level of the clock signal is by way of example only, and functionally equivalent embodiments can be envisaged in which the levels described herein are replaced by different levels, for example references to a high clock signal could be replaced by a low clock signal, etc. Moreover, although embodiments are described herein with reference to three different types of latch circuit, this is illustrative and not exhaustive and the present disclosure is equally applicable to any suitable type of latch circuit. Where reference is made to any logical value, it is to be understood that this is for the purposes of example and the use of different logical values does not depart from the functionality of the embodiments. Description of the embodiments with reference to the upper and lower voltage rails is likewise purely illustrative. Any suitable transistors may be used in the embodiments, such as, for example, Field Effect Transistors (FETs), including MOSFETS, and Bipolar Junction Transistors. Finally, it will be apparent to the skilled person that reference to any particular type of gate is by way of example only, and numerous variants may be employed which provide the same functionality as the embodiments described herein.

While the present disclosure has been particularly shown and described with reference to some embodiments, it will be understood to those skilled in the art that various changes in form and detail may be made without departing from the scope of the invention as defined by the appendant claims.

What is claimed is:

1. A flip flop circuit, comprising:
    a first input circuit configured to receive a clock input signal and input data and comprising a first node; and
    a second input circuit configured to receive the input data and an inverse of the clock signal and comprising a second node;
    wherein the first and second input circuits are configured such that:
        the first node and the second node are pre-charged to respective complementary states when the clock signal is at a first level; and
        dependent on a value of the input data, one of said first and second nodes changes state to a state complementary to its pre-charged state when the clock signal transitions from the first level to a second level.

2. A circuit as claimed in claim 1, wherein the first and second input circuits are configured such that the change of state of said one of said first and second nodes causes the other of said first and second nodes to be driven to its pre-charged state.

3. A circuit as claimed in claim 1, wherein the first and second input circuits are configured such that, when the clock is at the second level, the state of said one of said first and second nodes is retained at said changed state independent of the value of the input data.

4. A circuit as claimed in claim 1, wherein the first input circuit comprises:
    a first transistor; and
    a second transistor coupled to a third node with a state complementary to the state of the second node;
    wherein the first transistor is controlled by the clock signal and the second transistor is configured to be controlled by the state of the third node and wherein the first and second transistors are configured such that the first node is driven to its pre-charged state when either the first or second transistor is switched on.

5. A circuit as claimed in claim 4, wherein the change of state of the second node to the complementary state of its pre-charged state causes the second transistor to turn on.

6. A circuit as claimed in claim 4, wherein the first input circuit further comprises a third transistor controlled by the clock signal, a fourth transistor controlled by the state of the third node, and a fifth transistor controlled by the input data, wherein the first node is driven to its complementary state when the third, fourth and fifth transistors are on.

7. A circuit as claimed in claim 6, wherein the fourth transistor is switched off when the second node changes state to the complementary state of its pre-charged state and on when the second node is at its pre-charged state.

8. A circuit as claimed in claim 7, wherein the first input circuit further comprises a sixth transistor arranged in parallel with the fifth transistor and coupled to a fourth node with a state complementary to the state of the first node, wherein the sixth transistor is on when the first node changes state to said complementary state so as to enable the first node to be driven to its complementary state independently of the input data when the clock is at the second level.

9. A circuit as claimed in claim 1, wherein the second input circuit comprises:
    a seventh transistor; and
    an eighth transistor coupled to a fourth node with a state complementary to the state of the first node;
    wherein the seventh transistor is controlled by an inverse of the clock signal and the eighth transistor is controlled by the state of the fourth node and wherein the seventh and eighth transistors are configured such that the second node is driven to its pre-charged state when either the seventh or eighth transistor is on.

10. A circuit as claimed in claim 9, wherein the change of state of the first node to the complementary state of its pre-charged state turns the eighth transistor on.

11. A circuit as claimed in claim 9, wherein the second input circuit further comprises a ninth transistor controlled by the inverse clock signal, a tenth transistor controlled by the state of the fourth node and an eleventh transistor activated by the input data, wherein the second node is driven to its complementary state when the ninth, tenth and eleventh transistors are on.

12. A circuit as claimed in claim 9, wherein the tenth transistor is off when the first node changes state to the complementary state of its pre-charged state and on when the first node is at its pre-charged state.

13. A circuit as claimed in claim 12, wherein the second input circuit further comprises a twelfth transistor arranged in parallel with the eleventh transistor and coupled to a third node with a state complementary to the state of the second node, wherein the twelfth transistor is on when the second node changes state to said complementary state so as to enable the second node to be driven to its complementary state independently of the input data when the clock signal is at the second level.

14. A circuit as claimed in claim 1, further comprising a latch circuit configured to maintain the value of an output signal when the clock is at the first level and to change the value of the output signal to a value of the input data when the clock transitions to the second level.

15. A circuit as claimed in claim 14, wherein the latch circuit functions as a set-reset latch, and the state of the first node provides an inverse-set state and the value of the second node provides a reset state.

16. A circuit as claimed in claim 14, wherein the latch circuit comprises an inverter configured to provide isolation of the output signal from a feedback loop within the latch circuit.

17. A circuit as claimed in claim 1, wherein the first input circuit comprises a first multiplexor and the second input circuit comprises a second multiplexor, the first and second multiplexors configured to receive the input data wherein the input data comprises a scan-input signal and a data input signal, and wherein the first and second multiplexors are configured such that the change of state of said one of said first and second nodes is dependent upon either the scan-input signal or the data input signal, wherein said dependence upon the scan-input signal or data input signal is determined by a scan-enable signal.

18. A circuit as claimed in claim 17, further comprising a latch circuit configured to receive an asynchronous reset input; wherein, when the asynchronous reset input is at a third level the latch circuit is configured to:

maintain the value of an output signal when the clock is at the first level and to change the value of the output signal to a value of the input data when the clock transitions to the second level; and when the asynchronous reset input is at a fourth level the latch circuit is configured to cause the output signal to be changed to a predetermined value independently of the clock signal or the input data.

19. A circuit as claimed in claim 17, wherein the first node is driven to its pre-charged state when the asynchronous reset input is at the fourth level.

20. A circuit as claimed in claim 18, wherein each of the first to fourth levels is at either a first value or a second value.

\* \* \* \* \*